United States Patent [19]

Vongfuangfoo et al.

[11] Patent Number: 5,598,775
[45] Date of Patent: Feb. 4, 1997

[54] CENTERING LID SEAL CLIP APPARATUS

[75] Inventors: Sutee Vongfuangfoo, Sunnyvale; Mirek Boruta, Castro Valley; Galen Kirkpatrick, Fremont, all of Calif.

[73] Assignee: LSI Logic Corporation, Milpitas, Calif.

[21] Appl. No.: 539,189

[22] Filed: Oct. 4, 1995

[51] Int. Cl.⁶ ............................................. B30B 9/00
[52] U.S. Cl. ................... 100/233; 24/511; 100/234; 100/268; 156/579; 269/238; 269/903
[58] Field of Search ................................. 100/233, 234, 100/265, 268; 24/499, 508, 511; 156/579; 269/238, 254 R, 254 CS, 269, 270, 903

[56] References Cited

U.S. PATENT DOCUMENTS

| | | | |
|---|---|---|---|
| 36,364 | 9/1862 | Oesterling | 269/254 CS |
| 145,945 | 12/1873 | Hewitt | 269/254 CS |
| 365,814 | 7/1887 | Henning | 24/511 |
| 1,325,895 | 12/1919 | Litchfield | 100/234 |
| 1,403,589 | 1/1922 | Cinquini | 269/238 |
| 1,464,374 | 8/1923 | Vestine | 24/511 |
| 1,586,314 | 5/1926 | Kiefer | 269/238 |
| 1,709,385 | 4/1929 | Young | 269/238 |
| 1,797,836 | 3/1931 | Paul | 269/254 CS |
| 2,183,680 | 12/1939 | Kahliff | 269/238 |
| 2,556,615 | 6/1951 | De Vaughn | 24/511 |
| 2,874,495 | 2/1959 | Fowler | 24/511 |
| 3,100,326 | 8/1963 | Buck | 24/511 |
| 3,429,567 | 2/1969 | Swan | 269/254 CS |
| 4,054,280 | 10/1977 | Alberts | 269/254 CS |
| 4,353,536 | 10/1982 | Mazzotta | 269/238 |
| 4,646,418 | 3/1987 | Hattori | 269/254 CS |
| 5,211,324 | 5/1993 | Fiedler | 228/44.3 |
| 5,465,470 | 11/1995 | Vongfuangfoo et al. | 269/903 |
| 5,495,646 | 3/1996 | Scrutchfield et al. | 24/499 |

FOREIGN PATENT DOCUMENTS 704444  2/1954  United Kingdom .................... 24/508

*Primary Examiner*—Stephen F. Gerrity
*Attorney, Agent, or Firm*—Luedeka, Neely & Graham, P.C.

[57]  ABSTRACT

A lid is sealed to an integrated circuit package using a spring biased pressure foot that is structurally carried by a secondary loading jig to impose sealant curing load on the lid. The secondary jig attaches to the fabrication boat at a position indexed to apply optimal assembly force at the package center normal of the package lid plane.

26 Claims, 8 Drawing Sheets

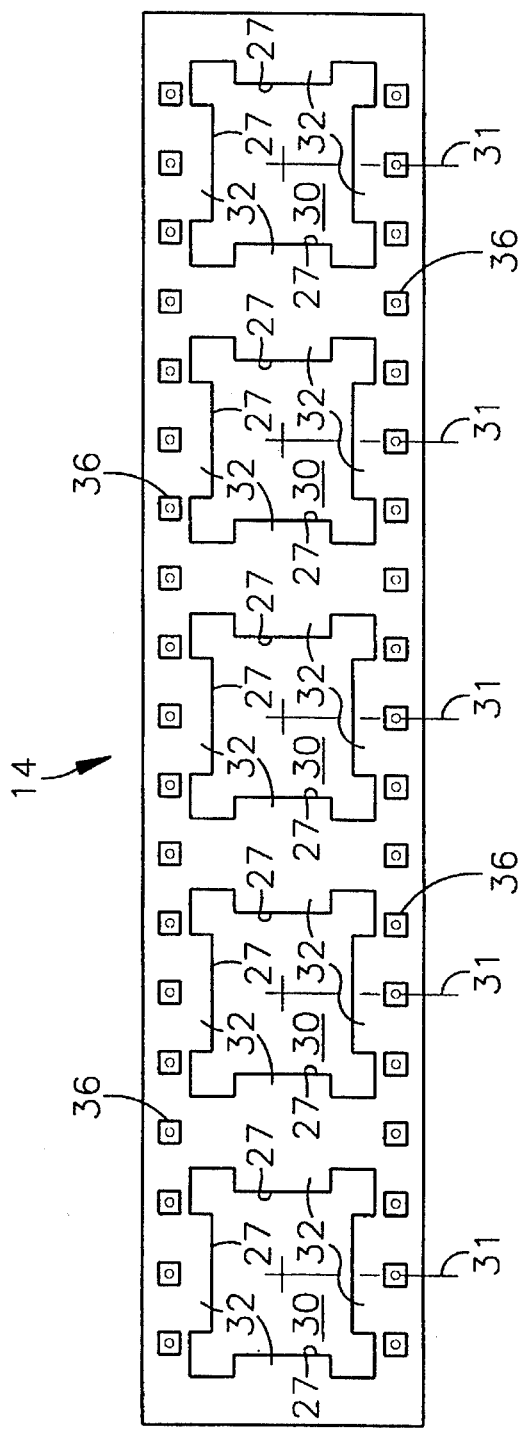
Fig. 5
Fig. 4
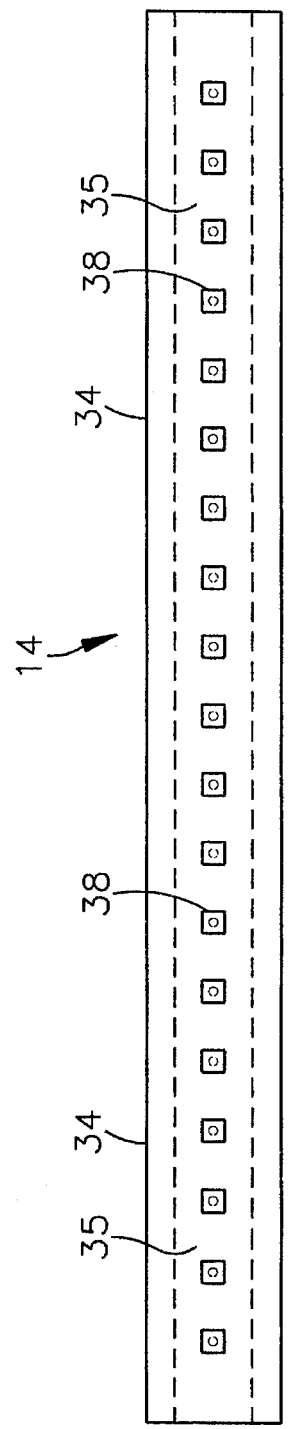
Fig. 6

CENTERING LID SEAL CLIP APPARATUS

BACKGROUND OF THE INVENTION

The present invention relates to integrated circuit (i.c.) fabrication methods and apparatus. In particular, the invention relates to methods and supporting apparatus to apply centered, perpendicular force to an integrated circuit package lid during the hermetic seal curing process interval.

Integrated circuits are frequently packaged for product assembly in sealed casements having only connector leads or points exposed for external conduit connection. Such packages are fabricated in laminated tiers with a dielectric base plate and a ceramic or plastic lid plate. Between the lamination tiers are two or more additional layers that route and electrically isolate electrical paths between specific circuit junctures on the integrated circuit chip and a corresponding connector lead or pin. The actual circuit chip is potted within a cavity surrounded by the laminations.

In the course of fabrication, as the laminations are added, vertically separated groups of connector leads are connected to the chip. Finally, the assembly is sealed by the addition of a cover or lid. Depending on the integrated circuit package type, the lid may be hermetically sealed by an epoxy adhesive or metallic solder, for example. Traditionally, the adhesive or solder is applied to either or both faces of the lid and substrate and cured or set while the lid is held down under a predetermined force applied by a spring clip. Unfortunately, excessive seal failures occur because of insufficient or inadequate distribution of seal force. These insufficiencies or inadequacies are perceived to arise from the lack of means to locate and direct the seal force along a central axis perpendicular to the lid plane.

It is, therefore, an object of the invention to provide an i.c. package lid seal clip that centers and maintains the position of the sealing force normal to the lid plane.

It is also an object of the invention to provide an attachment interface with an i.c. package assembly boat to uniformly locate and maintain the position of the clip sealing force.

Another object of the present invention is to provide a sealing load clip that may be reliably positioned at a predetermined location on an assembly boat and i.c. package lid.

SUMMARY OF THE INVENTION

These and other objects of the invention as will be apparent from the following descriptive detail, are served by a force application clip that attaches to a package fabrication boat at predetermined, process control, index positions to secure the clip at a position on the boat that brings a spring biased pressure foot perpendicularly against the package lid surface at substantially the center of the lid.

A package fabrication boat utilizes a plurality of package alignment sockets, each of which laterally confines and restrains movement of a respective package during the course of integrated circuit processing. Process control index holes in the top surface and side rails of the boat are aligned coordinately with the package sockets. Pins on the force application clip mesh with appropriate pairs of index holes to secure an aligned position of the force clip.

In one embodiment of the invention, a force applying pressure foot forms one end of a spring loaded rocker bar. The bar oscillates about a rocker axis that is parallel to the package lid surface but is biased in the pressure foot rotational direction for loading against the package lid.

Another embodiment of the invention includes a pressure foot secured to one end of an alignment shaft. The force clip includes structural guides to confine the alignment shaft and limit movement to axial reciprocation. A compression spring biases the pressure foot toward the package lid when the force clip is attached to an assembly boat.

BRIEF DESCRIPTION OF THE DRAWINGS

FIG. 4 is a plan view of an integrated circuit package assembly boat.

FIG. 5 is an end elevation of the package assembly boat.

FIG. 6 is a side elevation of the package assembly boat.

DESCRIPTION OF THE PREFERRED EMBODIMENTS

Figure 1:
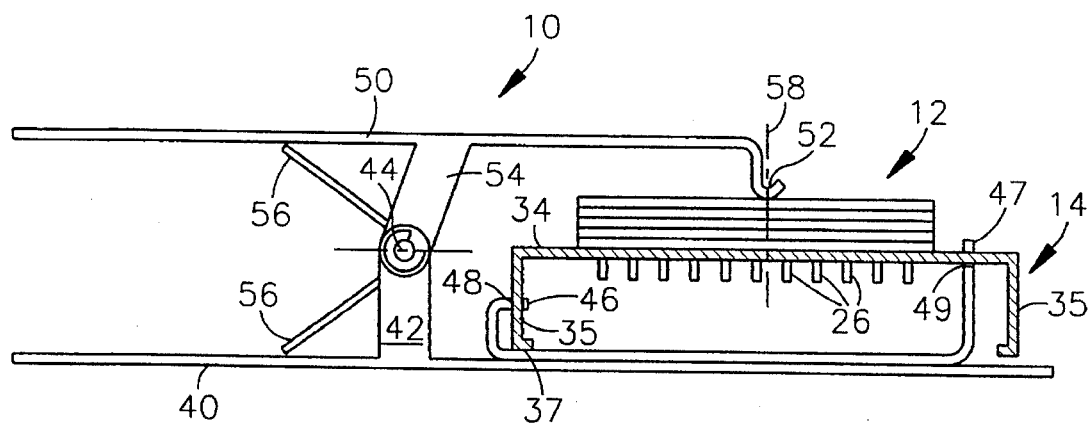
FIG. 1 is an end elevation of the invention first embodiment in operative combination with a package assembly boat.

Referring to FIG. 1 of the drawings wherein like reference characters designate like or similar elements throughout the several figures of the drawing, a first preferred embodiment of the invention 10 is shown as operationally engaged with an integrated circuit (i.c.) package 12 and a corresponding i.c. package assembly jig 14 characterized in the art as a "boat".

Figure 2:
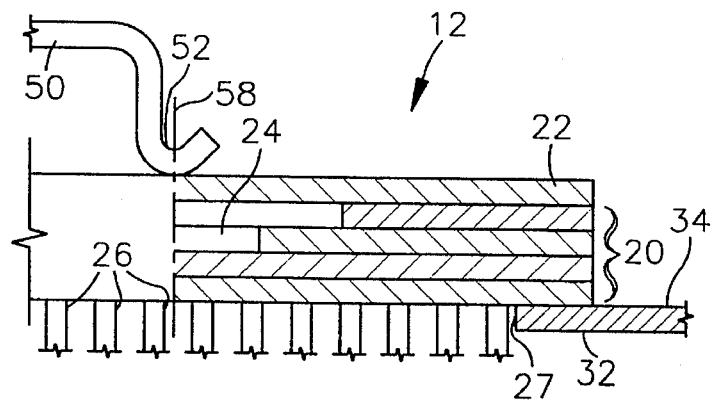
FIG. 2 is a partially sectioned detail of the first embodiment combination.
Figure 3:
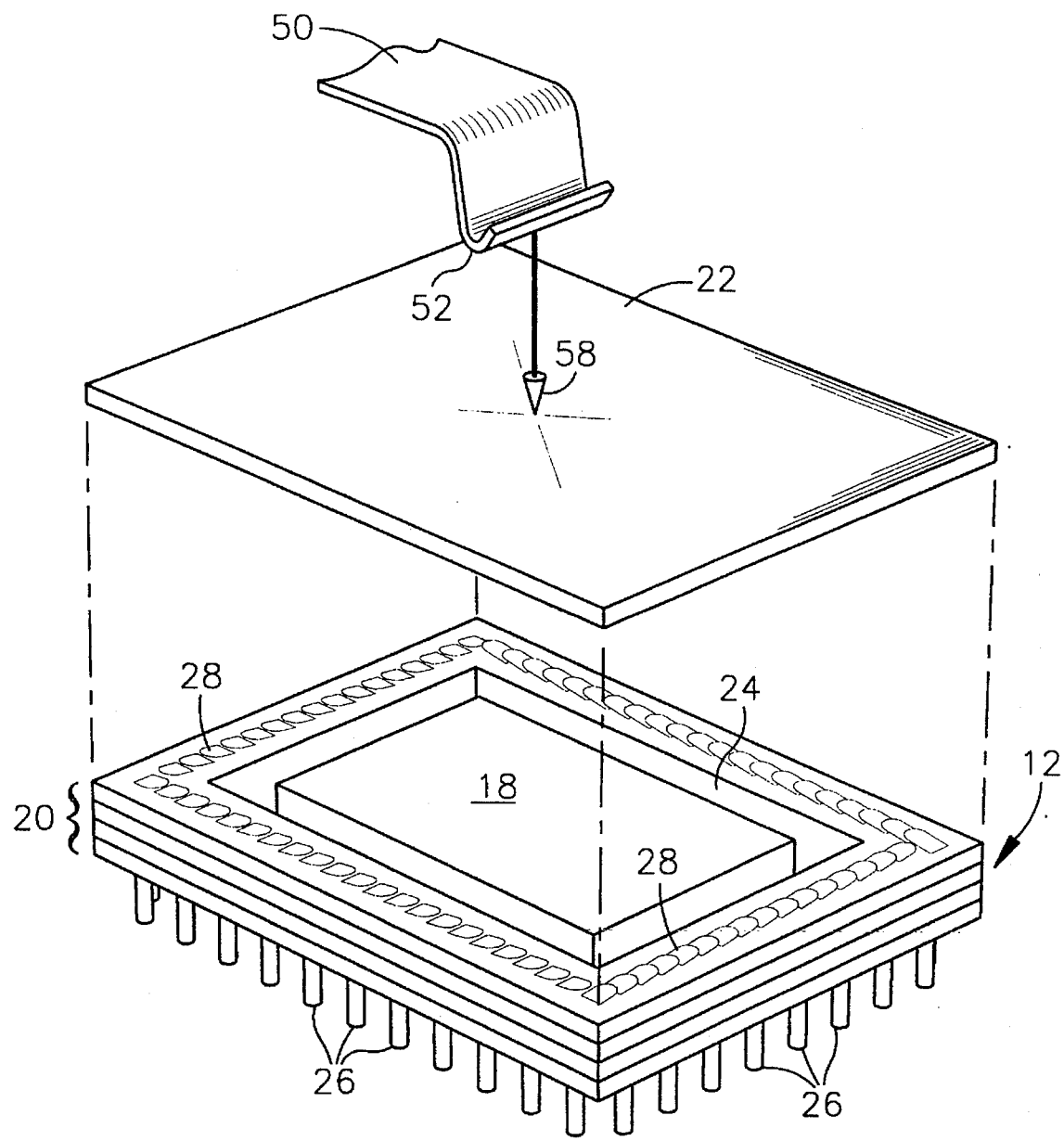
FIG. 3 is an exploded assembly view of an integrated circuit package.
Figure 7:
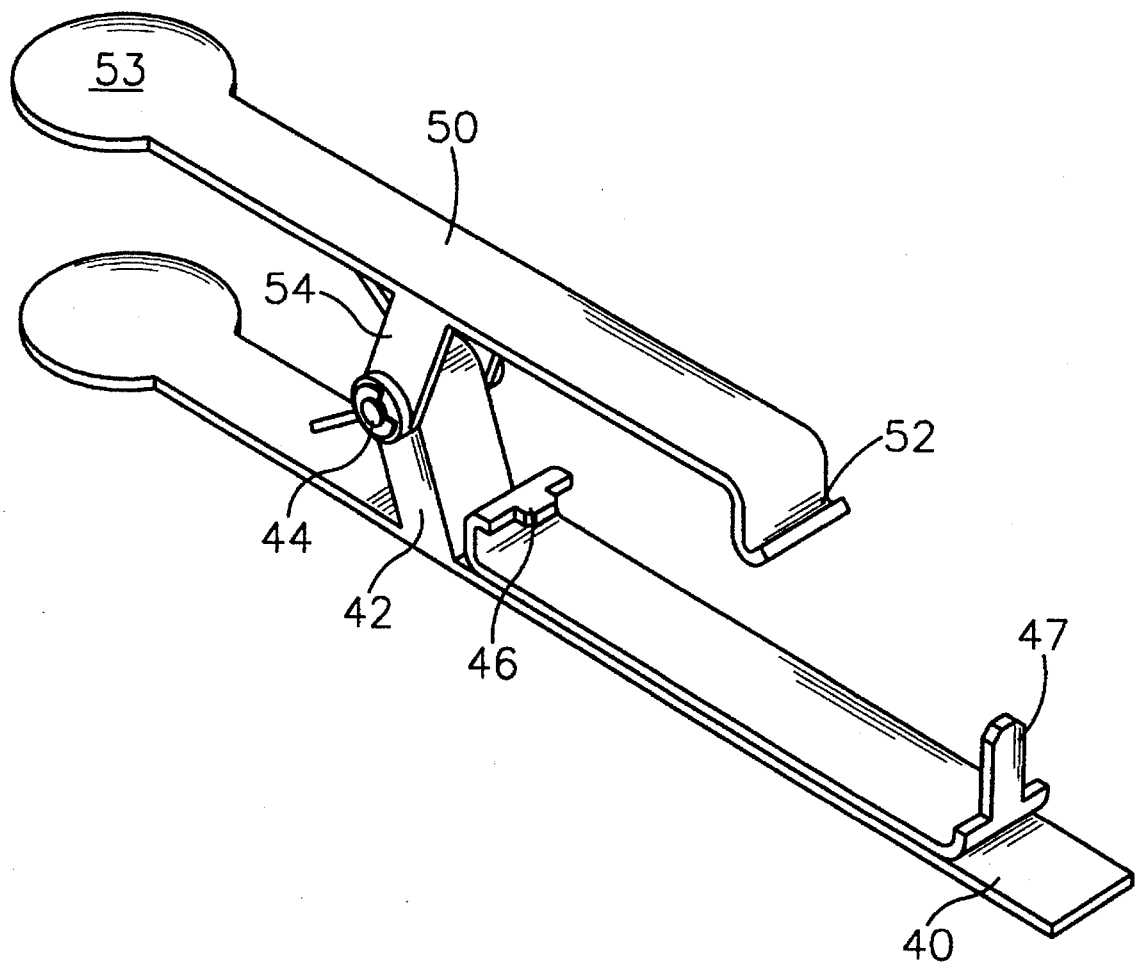
FIG. 7 is a pictorial view of a first embodiment of the invention.
Figure 9:
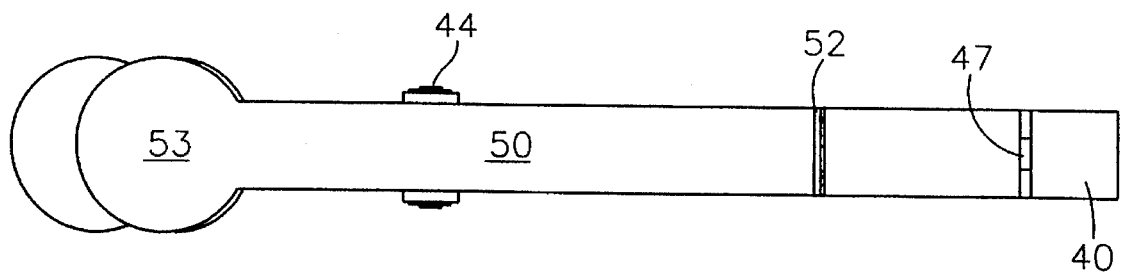
FIG. 9 is a plan view of the invention first embodiment.
Figure 8:
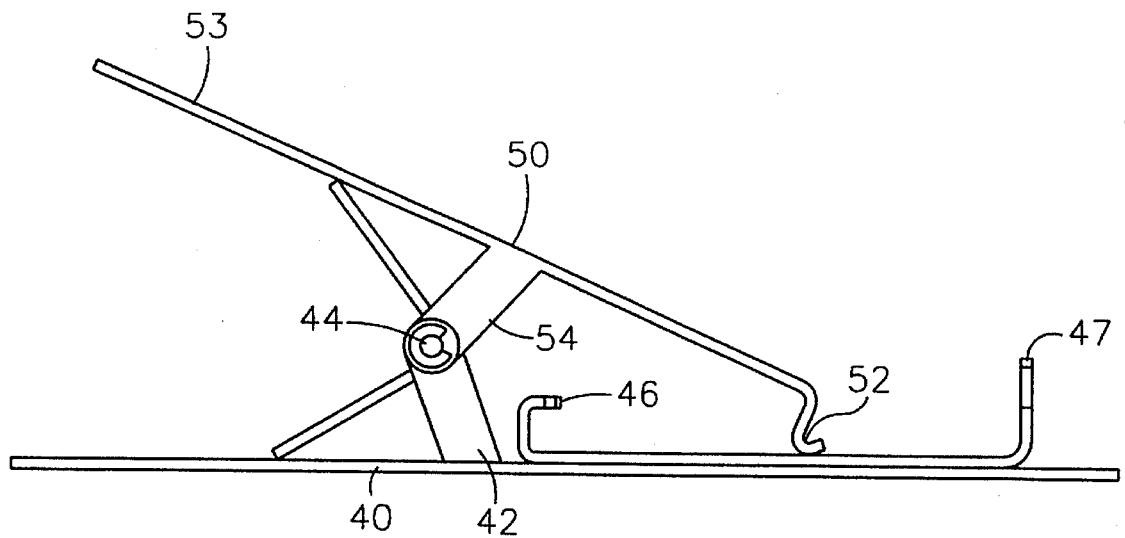
FIG. 8 is a side elevation of the invention first embodiment.

As best shown in the exploded assembly of FIG. 3 and the partial section of FIG. 2, the i.c. package 12 comprises a base 20 assembled as a laminated plurality of layers capped by a lid 22. The i.c. chip 18 is potted within the stepped void 24 (FIG. 2) formed within the center of the base lamination 20. The laminated layers 20 provide conductor separation between the i.c. chip and connector pins 26 projecting from the package bottom.

FIGS. 4, 5, and 6 illustrate the characteristics of an assembly boat 14 to include a multiplicity of package sockets 30 which are apertures in the boat top plate 34. Four tabs 32 around the perimeter of each socket 30 are integral extensions of the top plate 34. The spacial distances between oppositely facing edges 27 are dimensioned to receive the pin 26 base of a package 12 therebetween for lateral confinement and vertical support. Also in the boat top plate 34 along the longitudinal sides of the top plate are respective rows of index sockets 36. Additional index sockets 38 are formed in the boat side rails 35. It will be noted that a pair of index sockets 36 and 38 are aligned with the transverse centerlines 31 respective to each socket 30. Between each centerline 31, four, equidistant, index socket intervals are provided for this example.

With respect to FIGS. 1–3 and 7–9, a second jig in the cooperative assembly is a loading jig or spring force clip 10 comprising a base plate 40 having a pair of axle pedestals 42 projecting therefrom to support an axle 44. Also projecting from the base plate 40 are a pair of index pins 46 and 47. Pin 46 is turned substantially parallel with the base plate 40 whereas pin 47 projects substantially normal to the base plate 40 plane.

Pin 46 is flanked by abutment shoulders 48 and pin 47 is flanked by abutment shoulders 49. As shown by the assembly elevation of FIG. 1, the dimensional locations of pins 46 and 47 and their corresponding abutment shoulders are coordinated to the index sockets 36 and 38 of the assembly boat 14.

Clamping bar 50 includes a pressure foot 52 at one end and a hand pad 53 at the other end on opposite sides of the axle 44. Legs 54 rotatively support the bar 50 over the axle 44. A helically coiled tensile spring wrapped about axle 44 includes reaction arms 56 to resiliently bias rotation of the clamping bar about the axle 44. Such rotational bias is opposed at the pressure foot 52 by the i.c. package 12. Preferably, the spring clip components are dimensionally coordinated to position the point of pressure foot 52 engagement against the i.c. package lid 22 in the plane of the axle 44 axis and along the axis 58 at the center of the chip void 24. Here, the i.c. package lid is resiliently clamped with a perpendicular bearing load of known value, preferably in the range of about 1.5 lb. to 5 lb., at substantially the optimum position to provide a uniformly distributed curing pressure between the lid 22 and the lower lamination 20.

In operating process sequence, the i.c. package assembly (FIG. 3) is completed by application of an adhesive or solder 28 to the interfacing surfaces respective to the package lid 22 and the uppermost surface of the lamination 20. This assembly is positioned in a package socket 30 with the connector pins 26 laterally caged between the internal edges 27 of tabs 32. In most cases, this socket position will locate the i.c. assembly 12 center point in the transverse plane 31 which bisects the socket 30 and corresponding edge rail sockets 38 and top plate sockets 36.

The loading jig 10 is combined with the boat by depressing the clamping bar 50 at the hand pad 53 to lift the pressure foot 52 away from the base plate 40. In this configuration, the pin 46 is meshed with the edge rail socket 38 along an angular line of penetration until the shoulder 48 abuts the face of rail 35.

With the shoulder 48 against the rail 35, the loading jig 10 is rotated about the shoulder/rail engagement line thereby bringing the index pin 47 into meshing penetration of the corresponding top plate socket 36 until the shoulder 49 seats against the bottom face of the top plate 34.

With the index pins 46 and 47 meshed with corresponding sockets 38 and 36, respectively, the base edge 37 of rail 35 engages the transversely flat surface of base plate 40 to further immobilize and locate the loading jig 10 relative to the boat 14.

In this condition, the clamping bar is gently released to engage the lid covered i.c. package 12 with a constant and calibrated compression force applied at or very near the lid 22 center along the load axis 58. Such assembly may be repeated for an i.c. package in each of the boat sockets 30 in a particular boat 14. A completely assembled boat jig 14 secured by the present invention is stable against abrupt movement encountered by the boat jig in a further process conveyance line.

A second spring clip embodiment of the invention 16 is illustrated by FIGS. 10–13 to include a semi-box frame 60 having two pairs of legs 62 and 64, respectively, to laterally stabilize the frame 60 against the top plate 34 of the boat 14.

At respective ends of the frame 60 are indexing arms 66 and 68. Index arm 68 has a structurally rigid relationship to the semi-box frame 60 and stabilizing legs 62 whereas the indexing arm 68 is rotatable about the axis of axle pin 69. Preferably, rotation of index arm 68 is spring biased to maintain an engagement force against a boat rail 35. Indexing arm 66 carries index socket pin 70 which meshes with an appropriate edge rail index socket 38. The pivoting indexing arm 68 carries indexing pin 78 for engaging sockets 38 in the opposite side rail.

Dimensionally, the bottom edges of the stabilizing legs 62 and 64 are coordinated with the index pins 70 and 72 to secure a boat 14 to the semibox frame 60 structure with the boat top plate 34 perpendicular to the reciprocation axis 74 of a pressure foot 76. Also, the separation distance between the indexing arms and their relative spacing from the axis 74 is aligned for coincidence of the axis 74 with the lid load axis 58.

Figure 10:
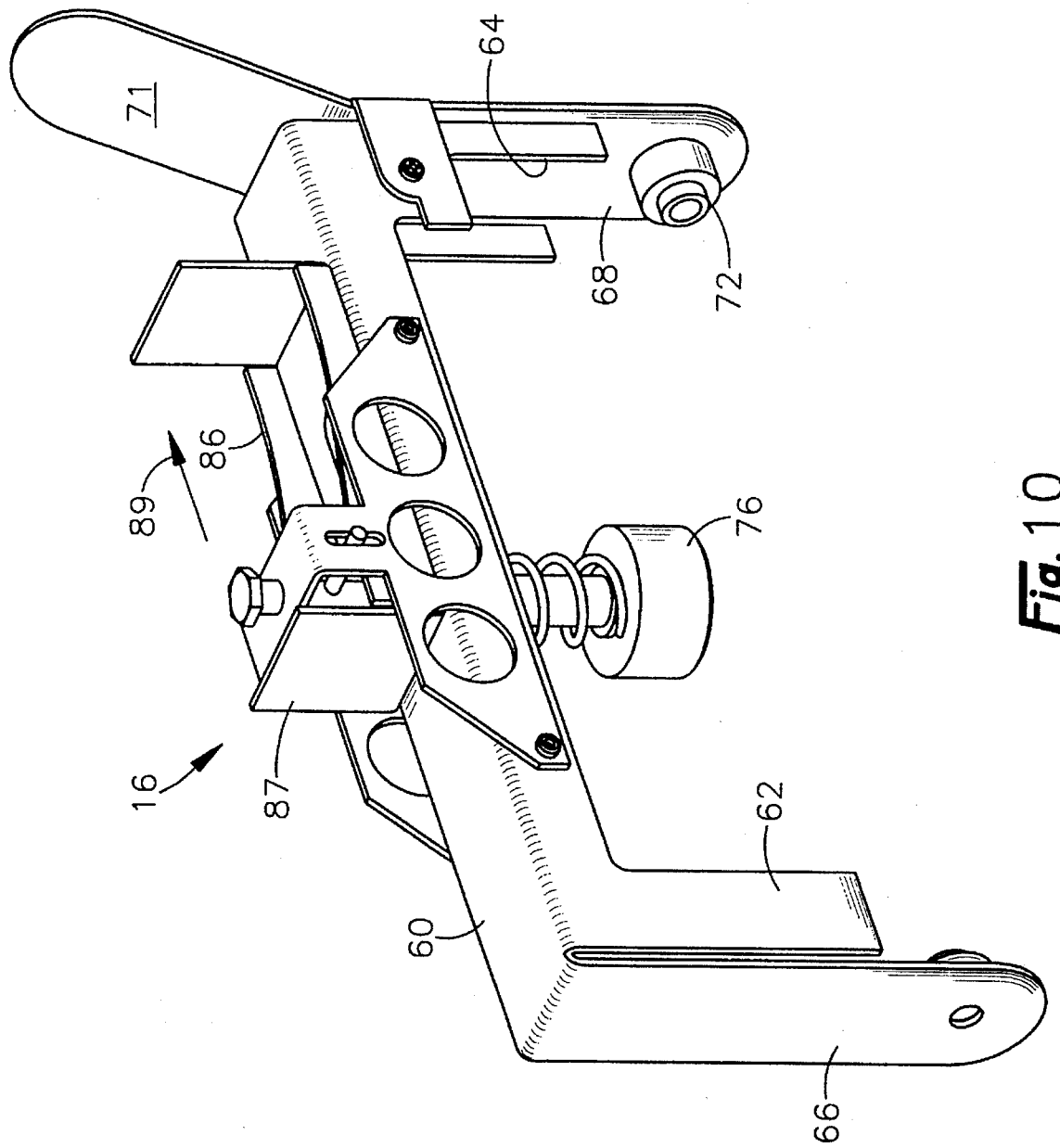
FIG. 10 is a pictorial view of a second embodiment of the invention.
Figure 12:
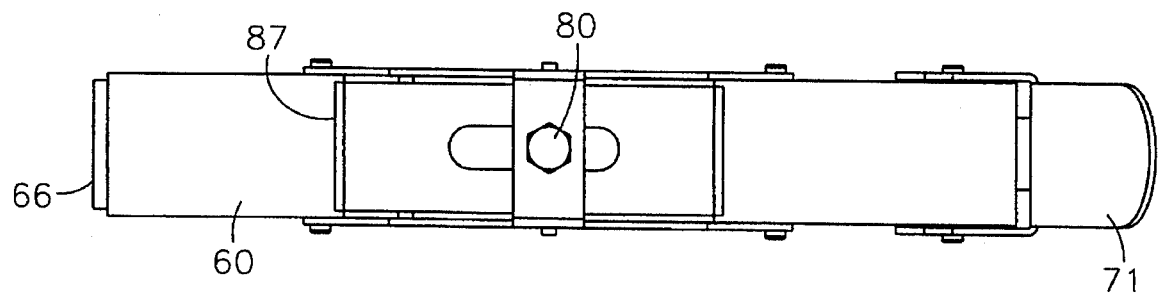
FIG. 12 is a top plan view of the invention second embodiment.
Figure 11:
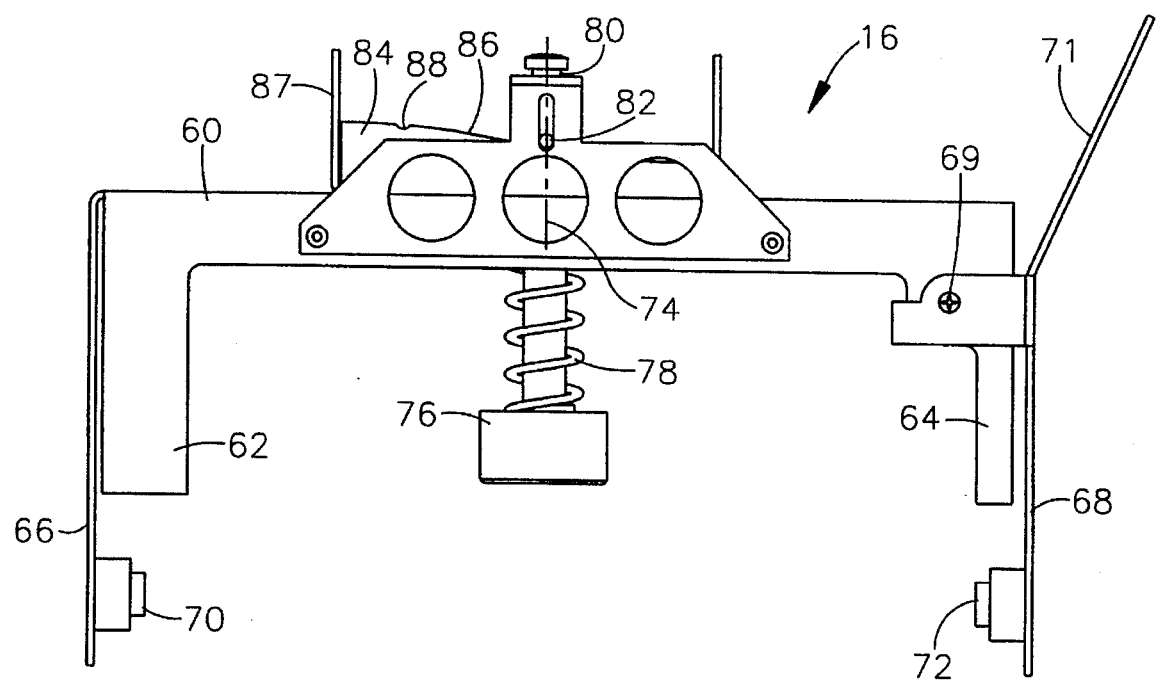
FIG. 11 is a side elevation of the invention second embodiment.
Figure 13:
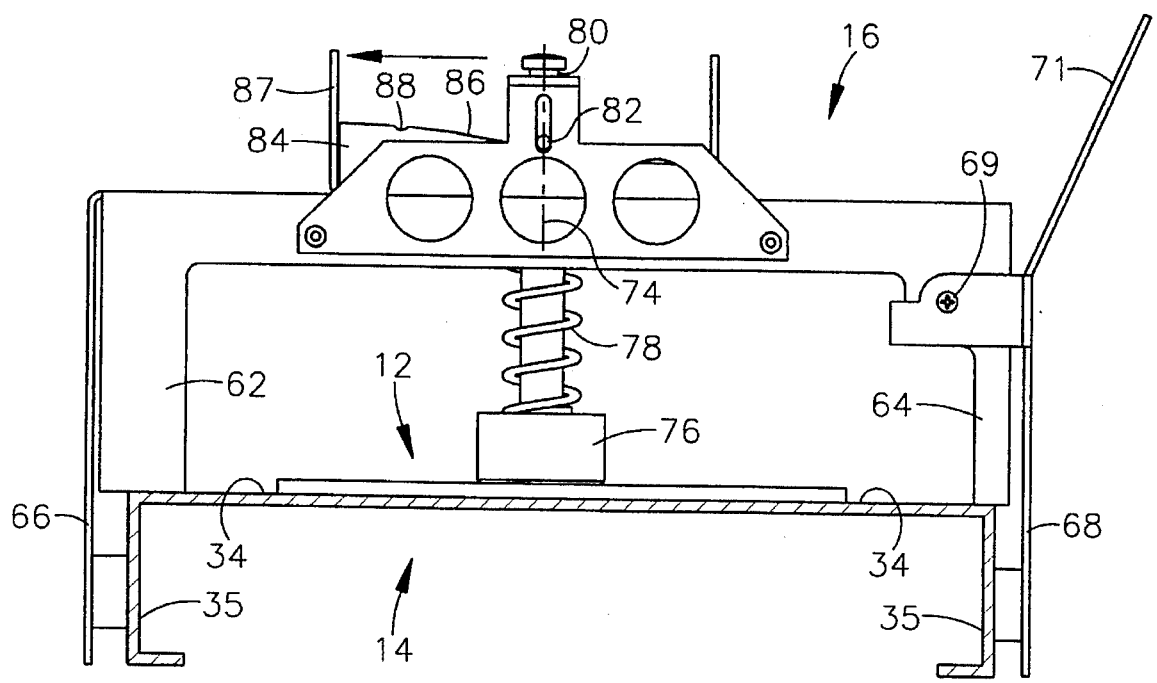
FIG. 13 is a side elevation of the invention second embodiment engaged with a package assembly boat.

Pressure foot 76 is secured to the distal end of a guide rod 80 and urged away from the semi box frame by a coiled compression spring 78 wound about the rod 80. A cross-pin or yoke bar 82 is secured to the guide rod 80 and rides on the ramp 84 edges 86. A detent pocket 88 is formed in the upper edge surfaces to stabilize the yoke bar 82 and guide rod 80 at the upper position at which the spring 78 is compressed and the pressure foot 76 is withdrawn from the i.c. package 12 surface. This relationship of the yoke bar 82 saddled into the pocket 88 is attained by sliding the ramp frame 87 to an extreme position in the direction of the arrowhead 89 (FIG. 10). When pushed to the extreme position in the opposite direction of arrowhead 90 (FIG. 13), the yoke bar 82 rides down on the ramp edges 86 and permits the compression spring 78 to load the pressure foot 76 against the i.c. package lid.

As with the first invention embodiment, the i.c. package and lid are positioned on the boat 14 socket 30 with adhesive or solder 28 applied between the lid 22 and lower lamination 20. When the pivotable index arm 68 is rotated about the axis 69 against a spring bias by manually squeezing between the thumb pad 71 and an upstanding tab of ramp frame 87, the pressure foot 76 and attached guide rod 80 are lifted against the bias of spring 78 and cocked in the detent 88. So configured, the loading jig 16 is aligned to insert the index socket pin 70 into the desired rail socket 38 located along the transverse center plane 31. This alignment will place the base of legs 62 and 64 on the surface of boat top plate 34. The pivotable index arm 68 is then released to mesh the index pin 72 with the axially opposite rail socket 38 thereby setting the loading jig 16 with the boat 14 and package 12. In this condition the ramp frame 87 is shifted to the left as viewed at FIG. 13 and the pressure foot 76 is released to engage the i.c. package 12.

Having fully disclosed the preferred embodiments of our invention, those of ordinary skill in the art will note obvious alternatives and equivalents for practicing the spirit of our invention. As our invention, therefore,

We claim:

1. An apparatus for applying a resilient force bias along a loading axis substantially central of and perpendicular to the lid of an integrated circuit package while such package is confined in a package alignment socket portion of an assembly boat having a substantially uniform width and first and second indexing pin apertures, said apparatus comprising: a frame member for transversely spanning an assembly boat width, a first indexing pin secured to said frame member and aligned along a first direction to penetrate a first indexing pin aperture in an assembly boat, a second indexing pin secured to said frame member and aligned along a second direction to penetrate a second indexing pin aperture in said assembly boat, the second direction of penetration being substantially different from the first direction of penetration; a rocker arm secured to said frame member for pivotal movement about a pivot axis; pressure foot means secured to said rocker arm for bearing against an integrated circuit package lid; and, resilient force means to bias the bearing of said pressure foot against said package lid.

2. An apparatus as described by claim 1 wherein said first and second directions of penetration are substantially perpendicular in substantially the same plane.

3. An apparatus as described by claim 2 wherein said pivot axis is substantially perpendicular to the plane of said first and second directions of penetration.

4. An apparatus as described by claim 3 wherein said rocker arm pivot axis is disposed between opposite rocker arm ends, said pressure foot means is disposed at one end of said rocker arm and a manual pressure pad at the opposite end of said rocker arm.

5. An apparatus as described by claim 4 wherein said resilient force means comprises coil spring means wound about said pivot axis to react between said frame member and said rocker arm.

6. An apparatus for applying a resilient force bias along a loading axis substantially central of and perpendicular to a integrated circuit package lid positioned upon an integrated circuit package that is confined in an assembly boat alignment socket, an assembly boat structure supporting said alignment socket having position indexing means for designating a position on said assembly boat relative to said alignment socket, said apparatus comprising; base means having positional confinement means for meshing with the assembly boat indexing means to secure a positional alignment of said base means along an assembly boat structure relative to an alignment socket; and, a resiliently biased pressure foot operatively secured to said base means for resiliently bearing against a lid of an integrated circuit package disposed in said assembly boat alignment socket along said loading axis.

7. An apparatus as described by claim 6 wherein said assembly boat indexing means comprises assembly boat indexing sockets and wherein said position confinement means comprises index meshing pins secured to said base means for penetrating selected assembly boat indexing sockets.

8. An apparatus as described by claim 7 wherein said index meshing pins mesh with said boat indexing sockets along respectively perpendicular penetration axes.

9. An apparatus as described by claim 8 wherein said pressure foot bias is imposed upon an integrated circuit package lid to compressively impose said assembly boat against support shoulders flanking at least one index meshing pin.

10. An apparatus as described by claim 6 comprising a rocker arm pivotable about an axis secure to said base means and aligned substantially parallel with an integrated circuit package disposed in said alignment socket, said rocker arm having opposite ends on respective opposite sides of said axis, said pressure foot being disposed at one of said ends and a manual pressure pad disposed at the other said end.

11. An apparatus as described by claim 10 having a tensile spring coiled about said axis and reacting against said rocker arm to bias said pressure foot against a package lid.

12. An apparatus for fabricating integrated circuit packages comprising a first jig having a plurality of planar package sockets for laterally confining an unfinished integrated circuit package and at least a pair of first indexing means for each package socket and a second jig having a manually withdrawn and resiliently biased pressure foot and a pair of second indexing means cooperative with said first indexing means to positionally secure said second jig to said first jig with said pressure foot aligned to impose a resilient force along a line substantially centrally of a respective socket and substantially perpendicular thereto.

13. An apparatus as described by claim 12 wherein said first indexing means comprises at least a pair of apertures in said first jig and said second indexing means comprises a pair of pins for meshing with the apertures of said first indexing means.

14. An apparatus as described by claim 13 wherein said second jig comprises a lever bar having opposite distal ends with said pressure foot disposed at one distal end said second jig further comprising a manual pressure pad disposed at a distal end of said lever bar opposite from said one end, said lever bar being secured to and partially rotatable about a rocker axis between said lever bar distal ends.

15. An apparatus as described by claim 14 having a spring coiled about said rocker axis, said spring being stressed to bias said pressure foot against the lid of an integrated circuit package.

16. An apparatus for fabricating integrated circuit packages comprising:

a first jig having a plurality of planar sockets for laterally confining a respective integrated circuit package and at least a pair of first indexing means for each socket; and, a second jig having a loading bar with respective bar ends, a rocker axis secured to said bar between said ends for bar oscillation about said rocker axis, one end of said bar including a pressure foot for bearing against an integrated circuit package lid confined in a respective socket, spring means for resiliently biasing rotation of said bar about said rocker axis toward bearing engagement of said pressure foot against said package lid, and second indexing means structurally combined with said rocker axis and loading bar to mesh with said first indexing means whereby said pressure foot is positionally confined at the substantial center of said integrated circuit package lid.

17. An apparatus as described by claim 16 wherein said first indexing means comprises a pair of apertures in said first jig and said second indexing means comprises a pair of pins projecting from said second jig.

18. An apparatus as described by claim 16 wherein said spring means comprises a coiled spring wound about said rocker axis.

19. An apparatus as described by claim 16 wherein said first indexing means comprises a multiplicity of equally spaced apertures in said first jig arranged in at least a pair of parallel rows.

20. An apparatus as described by claim 19 wherein said second indexing means comprises a pair of pins secured to said second jig to axially project therefrom for meshing with at least one aperture in each of at least two of said parallel rows.

21. An apparatus as described by claim 20 wherein axes respective to said projected pins are mutually perpendicular.

22. In an apparatus for fabricating integrated circuit packages comprising a boat jig having a plurality of regularly spaced alignment sockets for securing the lateral positionment of respective integrated circuit packages, said alignment sockets each having a central axis aligned substantially normal to an integrated circuit package positioned in a respective socket, said boat jig also having a plurality of first indexing means at regularly spaced locations relative to the central axis of each socket, the improvement comprising: a spring clip having a support base, a lever bar pivotally secured to said support base for rotation about a rotational axis, said lever bar having a loading foot proximate of one end thereof for resiliently bearing against an integrated circuit package along said central axis, and a second indexing means secured to said support base for cooperating with said first index means and for temporarily securing said spring clip at a position on said boat jig that aligns said loading foot with said central axis.

23. An apparatus as described by claim 22 wherein said first indexing means comprises a multiplicity of equally spaced apertures in said boat jig arranged in at least a pair of parallel rows.

24. An apparatus as described by claim 23 wherein said second indexing means comprises a pair of axially projected pins for meshing with at least one aperture in each of at least two of said parallel rows.

25. An apparatus as described by claim 24 wherein axes respective to said projected pins are mutually perpendicular.

26. An apparatus as described by claim 22 wherein said improvement further comprises a coil spring wound about said rotational axis to rotationally bias said lever bar.

* * * * *